United States Patent [19]
Davies et al.

[11] Patent Number: 5,313,206
[45] Date of Patent: May 17, 1994

[54] SUB-RANGING ANALOGUE TO DIGITAL CONVERTER USING DIFFERENTIAL SIGNALS AND DIRECT CURRENT SUBTRACTION

[75] Inventors: Christopher Davies; James D. Y. Collier, both of Cambridge, England

[73] Assignee: Cambridge Consultants Limited, Cambridge, England

[21] Appl. No.: 927,472
[22] PCT Filed: Apr. 2, 1991
[86] PCT No.: PCT/GB91/00508
§ 371 Date: Sep. 28, 1992
§ 102(e) Date: Sep. 28, 1992
[87] PCT Pub. No.: WO91/15899
PCT Pub. Date: Oct. 17, 1991

[30] Foreign Application Priority Data

Apr. 3, 1990 [GB] United Kingdom ............ 9007465

[51] Int. Cl.⁵ .......................................... H03M 1/14
[52] U.S. Cl. ................................ 341/156; 341/122
[58] Field of Search ............ 341/122, 144, 155, 156, 341/158, 159

[56] References Cited

U.S. PATENT DOCUMENTS

| | | | |
|---|---|---|---|
| 3,597,761 | 8/1971 | Fraschilla et al. | 340/347 AD |
| 3,721,975 | 3/1973 | Brinkman et al. | 340/347 AD |
| 4,058,806 | 11/1977 | Nadler | 340/347 AD |
| 4,897,656 | 1/1990 | Van de Plassche et al. | 341/159 |
| 4,912,469 | 3/1990 | Van de Grift et al. | 341/159 |
| 5,072,220 | 12/1991 | Petschacher et al. | 341/156 |
| 5,151,700 | 9/1992 | Matsuzawa et al. | 341/156 |

Primary Examiner—Howard L. Williams
Attorney, Agent, or Firm—Albert C. Smith

[57] ABSTRACT

An analogue to digital converter comprising a first analogue to digital conversion stage (14) for performing a relatively coarse conversion on a sample of an analogue input signal; a sample and hold stage (13) for holding the sample of the analogue signal fed to the first conversion stage while it is converted by the first conversion stage; a digital to analogue conversion stage (15) to which the digital output from the first conversion stage is fed; a difference circuit (16) for generating an analogue difference signal representing the difference between the signal held by the sample and hold stage (13) and the output from the digital to analogue conversion stage (15); a second analogue to digital conversion stage (17) for generating a digital output corresponding to the difference signal; and a combining unit (18) for combining the digital outputs of the first and second conversion stages to generate a digital output representing the sampled analogue input signal. The sample and hold stage (13) and the first and second analogue to digital conversion stages (14, 17) each responds to a respective pair of differential input signals. The sample and hold (13) and digital to analogue conversion stages (15) each generate output signals in the form of differential pairs of currents. The difference circuit (16) arithmetically combines appropriate pairs of the currents from the sample and hold and digital to analogue conversion stages to generate a differential current pair for input to the second analogue to digital conversion stage.

6 Claims, 4 Drawing Sheets 5,313,206

SUB-RANGING ANALOGUE TO DIGITAL CONVERTER USING DIFFERENTIAL SIGNALS AND DIRECT CURRENT SUBTRACTION

FIELD OF THE INVENTION

This invention relates to analogue to digital converters, and more particularly to such converters which operate on differential signals.

BACKGROUND OF THE INVENTION

One of the major problems with converters of the kind described implemented in monolithic (integrated circuit) form results from inherent errors within the components of the circuit. For example, the sample and hold stage generally incorporates a solid state switch to enable the input analogue signal to be samples. When such a switch is operated there is always charge breakthrough from the switch logic drive to the hold capacitor. This can be a very serious source of error and efforts are made to minimise it. These usually require the provision of very good switches (e.g. MOSFET or JFET) and a large hold capacitor. Since bipolar IC processes are more suited to high speed analogue circuitry, the requirement for FET devices complicates the process. Furthermore, since the hold capacitor needs to be large, it must either be sited off the chip on which the other components are provided or it will occupy a very large area of the chip. A further problem is that any input bias current required by the output amplifier of the sample and hold circuit discharges the hold capacitor and so the output "droops" with time. Another problem is that conventional analogue to digital conversion stages, for example flash converters, have a rather different structure from the sample and hold circuit leading to difficulties with variations in processing times.

Problems have also arisen with the second analogue to digital conversion stage. Conventionally, these have made use of high gain amplifiers with feed back around them to provide the necessary gain. While the signal is being acquired for the first conversion stage, the inputs to this feed back amplifier may be as large as the full input range of the converter, consequently the output of the amplifier will be driven into saturation. Gain switching and clamping stages are usually employed with these amplifiers to avoid this.

EP-A-0311105 describes an analogue to digital converter which includes a flash converter but which operates on a feed back principle and suffers from the problems described above in connection with inherent errors. WO-A-90/03066 also discloses a flash converter but again this suffers from the disadvantages described above.

SUMMARY OF THE INVENTION

In accordance with the present invention, an analogue to digital converter of the kind described is characterised in that the sample and hold stage and the first and second analogue to digital conversion stages each responds to a respective pair of differential input signals; in that each of the sample and hold and digital to analogue conversion stages generates output signals in the form of differential pairs of currents; and in that the difference means arithmetically combines appropriate pairs of the currents from the sample and hold and digital to analogue conversion stages to generate a differential current pair for input to the second analogue to digital conversion stage.

The invention relates to an analogue to digital converter of the kind comprising a first analogue to digital conversion stage for performing a relatively coarse conversion on a sample of an analogue input signal; a sample and hold stage for holding the sample of the analogue signal fed to the first conversion stage while it is converted by the first conversion stage; a digital to analogue conversion stage to which the digital output from the first conversion stage is fed; difference means for generating an analogue difference signal representing the difference between the signal held by the sample and hold stage and the output from the digital to analogue conversion stage; a second analogue to digital conversion stage for generating a digital output corresponding to the difference signal; and combining means for combining the digital outputs of the first and second conversion stages to generate a digital output representing the sampled analogue input signal. Such converters are hereinafter referred to as of the kind described.

We have devised a new form of analogue to digital converter of the kind described which operates throughout on a differential principle. This has the immediate advantage that due to the symmetry between the two signals making up each differential pair, inherent errors introduced by the electronic components are automatically compensated when the two signals are processed together. This should be contrasted with EP-A-0311105, for example, where differential operation is confined to one section of the converter.

Operating in this differential mode also considerably simplifies the construction of the difference means. For example, the difference means can comprise a pair of resistors connected in series, the resistor pair being connected in parallel with the second analogue to digital conversion stage, the current outputs of opposite type from the sample and hold and digital to analogue stages being combined at respective points connected in parallel with the resistor pair.

Typically, the difference means will arithmetically sum the current outputs of opposite type from the sample and hold and digital to analogue conversion stages.

Preferably, the output currents from the sample and hold stage will be of the form $$I/2 \pm g_m V_{in}/2$$

where

I is the total current generated by the sample and hold circuit,
$g_m$ is a scaling factor, and
$V_{in}$ is the input analogue signal.

Preferably, the digital to analogue conversion stage has $2^N$ current sources, each generating a current having a magnitude of $i/2$, wherein N is the maximum number of bits in the output signal from the first analogue to digital conversion stage, and wherein the output currents from the digital to analogue conversion stage are of the form $$2^{(N-1)} i/2 = Ki/2$$

where

K is an integer dependent on the magnitude of the input analogue signal to the first analogue to digital conversion stage.

DESCRIPTION OF THE DRAWINGS

An example of an analogue to digital converter in accordance with the present invention will now be described and contrasted with a known converter with reference to the accompanying drawings, in which:-

DESCRIPTION OF THE PREFERRED EMBODIMENT

Figure 1:
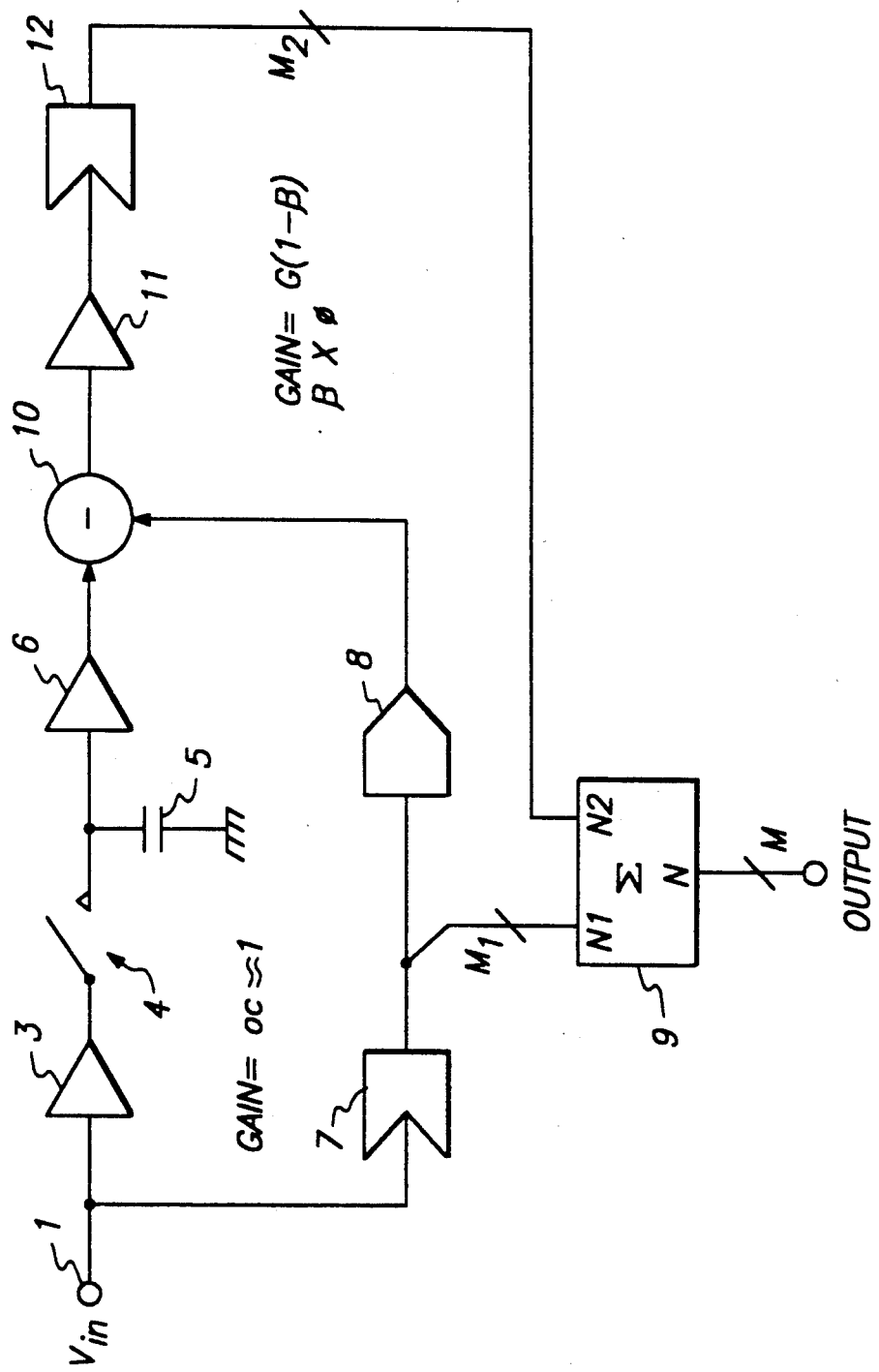
FIG. 1 is a block circuit diagram of a conventional analogue to digital converter.

The analogue to digital converter shown in FIG. 1 has an input terminal 1 to which an analogue signal Vin to be digitised is fed. This signal is fed to a sample and hold stage 2 which comprises a buffer 3, solid state switch 4, holding capacitor 5 and a further buffer 6.

The input signal Vin is also fed to a flash converter 7 which performs a coarse (M1 bit quantisation) on the input signal, the digital output (N1) from the flash converter 7 being fed to a digital to analogue converter (DAC) 8 and to an arithmetic logic unit (ALU) 9. The DAC 8 has only a low resolution (number of bits=M1) but it must have the accuracy of the full converter for adequate performance. The analogue output signal from the DAC 8 is fed to a subtraction circuit 10 where it is subtracted from the sampled and held signal from the sample and hold stage 2 to generate an analogue signal representing the difference between the two input signals. The difference or residue is amplified by an amplifier 11 having a gain of G (1−b), amplified residue signal being fed to another flash converter 12. The flash converter 12 outputs a digital signal N2 having M2 bits which is fed to a second input of the ALU 9 where, following a binary shift (equivalent to dividing the binary input number by G) it is added to the binary values N1 from the flash converter 7 to generate the final binary output value N having M bits.

Referring to FIG. 1, N is the number that is output by the ADC.

$$N = N1 + \frac{N2}{G}$$

$$N1 = Vin - \epsilon q1$$

where εq1 is the quantisation error of the first converter 7. Residue is thus:

$$\alpha Vin + \epsilon sh - (N1 + \epsilon dac) = (\alpha - 1)Vin + \epsilon q1 - \epsilon dac + \epsilon sh$$

where α (=1) is the gain of the sample and hold stage 2, εsh is the error introduced by the sample and hold stage, and εdac is the error introduced by the DAC 8.

$$N2 = G(1-\beta)((\alpha-1)Vin + \epsilon q1 - \epsilon dac + \epsilon sh) + \epsilon q2$$

where εq2 is the quantisation error of the second converter, so, $$N1 + \frac{N2}{G} = Vin - \epsilon q1 + (1-\beta)((\alpha-1)Vin + \epsilon q1 - \epsilon dac + \epsilon sh) + \frac{\epsilon q2}{G}$$

$$= Vin - \epsilon \text{(defines total error, } \epsilon\text{)}$$

and thus $$\epsilon = (\alpha - 1)Vin - \beta\epsilon q1 - \epsilon dac + \epsilon sh + \frac{\epsilon q2}{G}$$

since $$\beta << 1 \text{ and } \alpha = 1.$$

M1 and M2 are typically 6-8 bits, and the two are combined to make a 12-14 bit converter.

It will be seen therefore that each component in the converter introduces an error which affects the performance of the converter.

Figure 2:
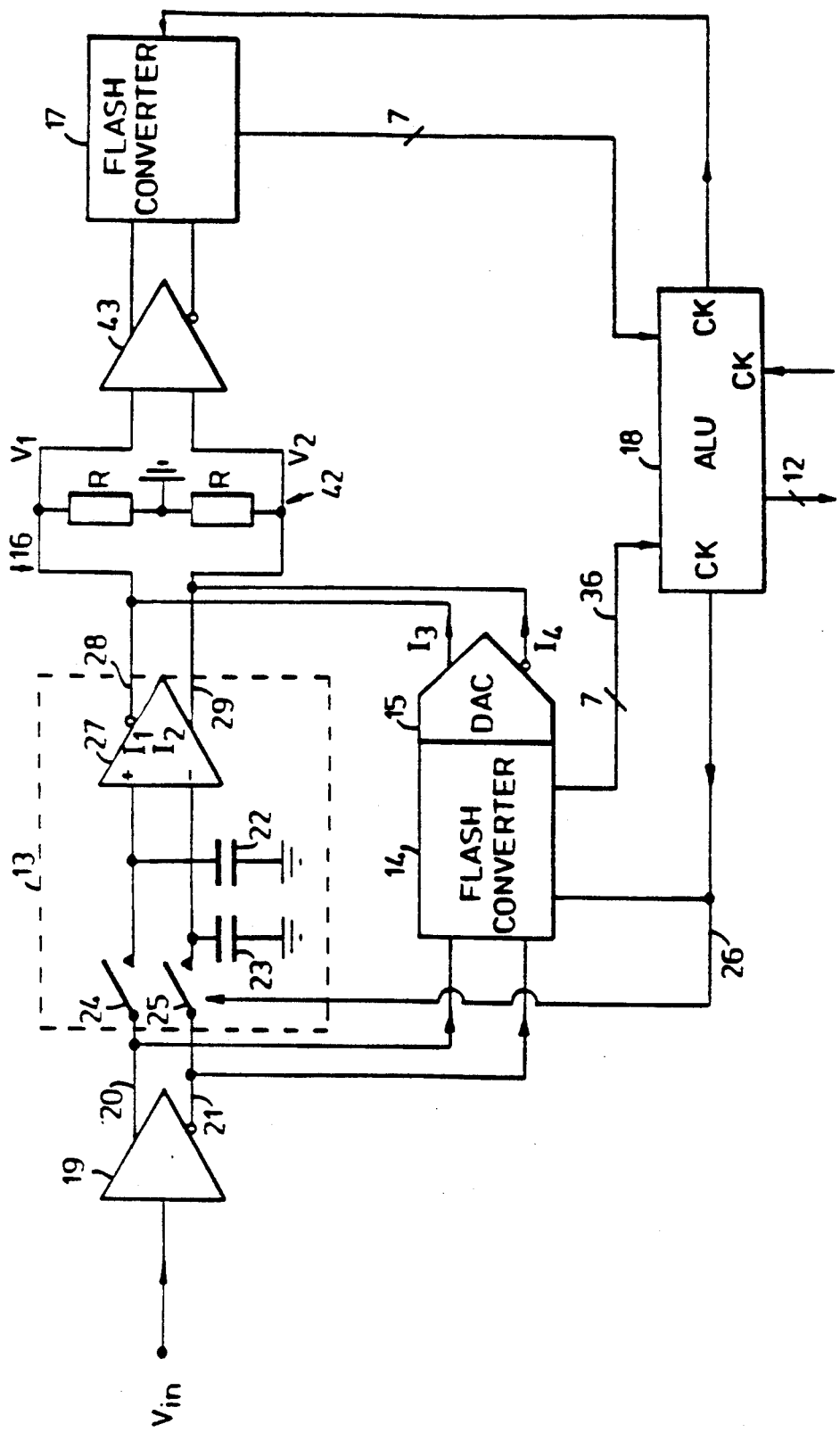
FIG. 2 is a block diagram of an example of converter according to the invention.

FIG. 2 illustrates an example of an analogue to digital converter according to the invention. This converter has a sample and hold stage 13, a flash converter 14 and DAC 15, a subtraction circuit 16, a second flash converter 17, and an ALU 18.

The input signal Vin is fed initially to a unity gain, amplifier 19 which generates a differential voltage output on a pair of lines 20, 21. The signal on line 20 is Vin while the signal on line 21 is −Vin.

The two signals are fed to the sample and hold stage 13 which has a pair of holding capacitors 22, 23 associated with the lines 20, 21 respectively. The lines 20, 21 are selectively coupled with holding capacitors 22, 23 via switches 24, 25 controlled by a clock signal from the ALU 18 via a line 26. The capacitors 22, 23 are connected to respective inputs of a differential amplifier 27 which acts as a current source generating a total current $I_T$. The amplifier 27 generates a pair of current output signals on lines 28, 29 denoted by I1, I2 respectively. These currents are given by the following formulae:

$$I1 = I_T/2 - gm\, Vin/2$$

$$I2 = I_T/2 + gm\, Vin/2$$

It will be seen from these formulae that the inherent errors due to switch charge breakthrough and droop which the conventional single-ended sample and hold stage had have been eliminated by making use of the differential processing.

Figure 3:
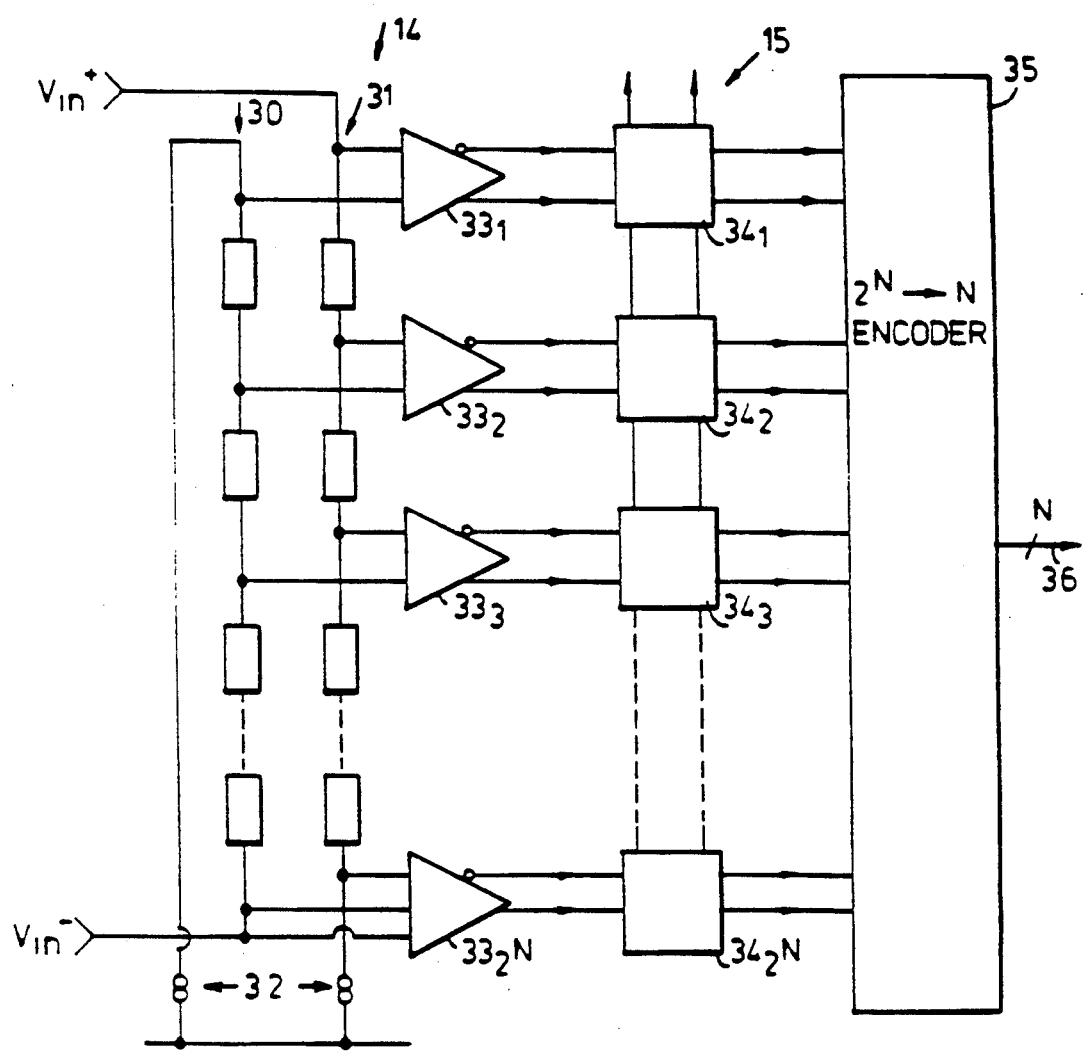
FIG. 3 is a block circuit diagram of the flash converter and digital to analogue converter shown in FIG. 2.

The signals on the lines 20, 21 are also fed to a combined flash converter 14 and DAC 15 which is shown in more detail in FIG. 3. The flash converter 14 has two chains of resistors 30, 31 each of which is connected in series with a current source 32 delivering a current I. Each resistor of each chain is associated with a respective comparator $33_1-33_2{}^N$. The non-inverting input of each comparator $33_1-33_2{}^N$ is connected to the resistor chain 31 and the inverting input to the resistor chain 30. The resistor chains serve to cause different reference voltages to be applied to each comparator so that only one of the comparators will be active at any one time, the active comparator being dependent on the value of the input signal Vin. In this example, the jth comparator is active when $$V_{in}^- - (2^N-j)IR = V_{in}^+ - jIR$$

$$V_{in}^- - V_{in}^- = 2Vin = (j-2^{(M-1)})2IR = 2KIR$$

where R is the resistance of each of the resistors in the chains 30, 31, $$K = j - 2^{(N-1)}$$

so K=Vin/IR

The active comparator generates a differential output consisting a complementary version of the active indicating signal which are passed via respective sub-units $34_1$-$34_{2^N}$ of the DAC 15 (without alteration) to a $2^N$ to N encoder 35. The encoder 35 generates an N bit digital output signal corresponding to a coarse quantisation of the input signal Vin which is fed via a line 36 to the ALU 18.

Figure 4:
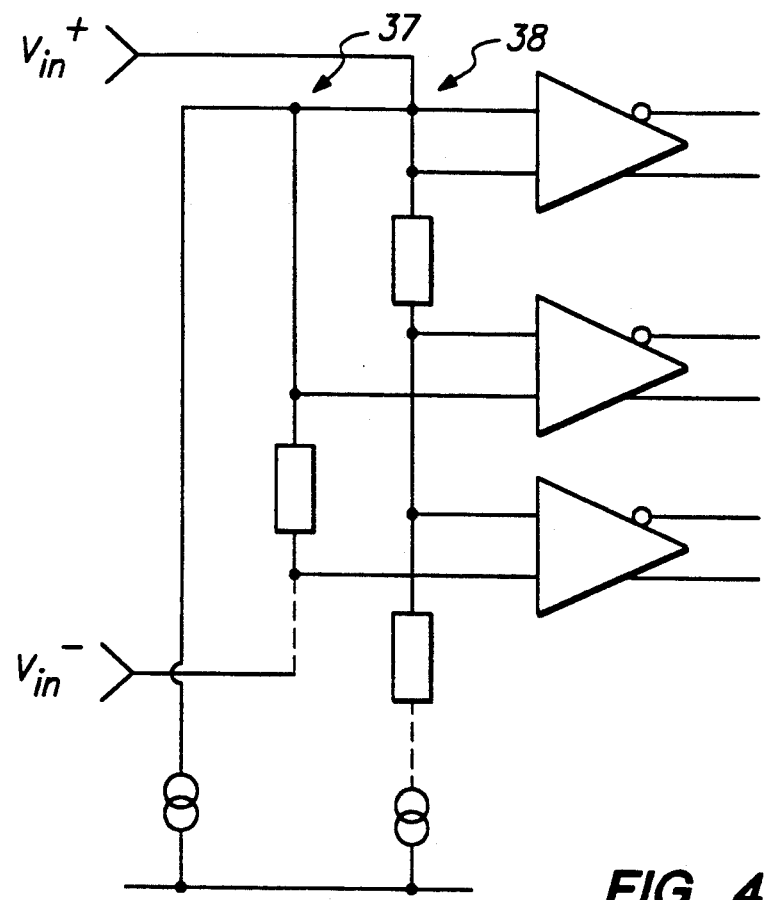
FIG. 4 illustrates part of a modified form of flash converter.

A modified form of the flash converter 14 is shown in FIG. 4 in which two chains 37, 38 of resistors are used but with half the number of resistors of the FIG. 3 example. In this case, the jth comparator is active when $$V_{in}^+ - V_{in}^- = 2Vin = 2IR(j-2^{(N-1)}) = 2\ KIR$$

so K=Vin/IR

The advantages of the differential flash converter bias and resistor chains are:

* Each comparator has a constant total resistance in series with its input thus signal propagation delays will be more constant than for the conventional approach.

* A zero voltage input ($V_{in}^+ = V_{in}^-$) results in a half full scale output which, when applied to the DAC, results in both outputs giving the same current output, whereas the conventional bias chain needs two reference voltage sources, one at KVref/2 and one at $-$Vref/2 to achieve this. Voltage sources are large and power—inefficient in an IC.

The input bias currents of the individual comparators create a change in shape of the voltage—code characteristic but do not introduce a curvature. Conventional flash converters suffer from a "bowing" of the characteristic due to input bias current and to limit this requires lower restistance bias chains with more current wasted in them.

A bowing is an uncorrectable error source but a change of slope may be removed by altering the current in sources 32 appropriately.

Figure 5:
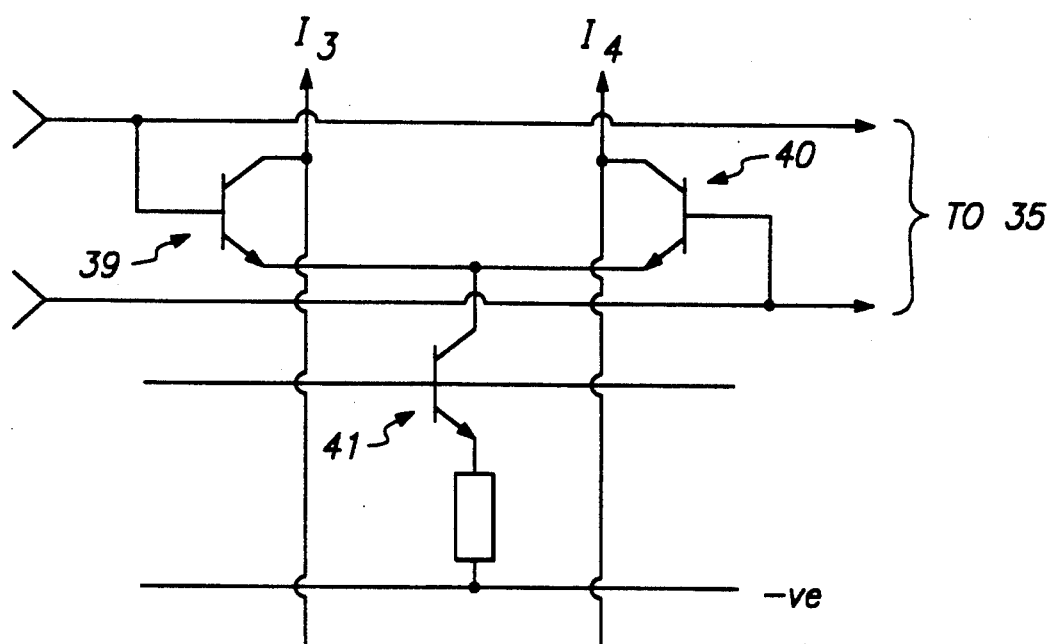
FIG. 5 is a circuit diagram of one of the digital to analogue converters shown in FIG. 3.

The DAC 15, as already explained, comprises a number of sub-units $34_1$-$34_{2^N}$ each of which constitutes a current source generating a current i/2. An example of one of the sub-units $34_1$ is shown in FIG. 5. The sub-unit shown in FIG. 5 comprises two npn transistors 39, 40 which act as switches controlled by the signals from the corresponding comparator 33 to cause appropriate currents to flow to the next higher sub-unit. The total currents output by the DAC 15 are denoted I3, I4.

Conventionally, an N bit DAC comprises N binarily weighted current sources and switches. Consequently the delay between the first flash converter sample clock and the settling of the current output to its eventual correct value includes a $2^N$ to N bit encode stage.

In this new approach the outputs of the comparators are used to switch directly $2^N$ equal current sources thus avoiding this delay. The approach also overcomes the problems or providing scaled sources on an IC as well as reducing linearity errors which could otherwise occur since in a large number of identical sources they may be expected to partially cancel on statistical grounds.

This has a further advantage best illustrated by example: Suppose the flash converter/dac has 64 stages and the overall converter is to have a 12 bit accuracy:

For monotonicity a DAC must have the most significant bit equal to the sum of all the lower significant bits, plus one LSB, with a tolerance of ±1 LSB.

A 12 bit accurate DAC will need the most significant source (=$2^{11}$ LSBS) accurate to ±1LSB, or 1 part in $2^{11}$ (488 ppm). The DAC 15, to obey the same criterion, needs the increment of 1 of the 64 stages (=$2^{12}/64 = 2^6$LSB) to be accurate to ±1 LSB, i.e. accurate to 1 part in $2^6 = 15625$ ppm, clearly less onerous.

The currents I3, I4 are defined by the formulae $$I3 = (2^{(N-1)} + K)i/2$$

$$I4 = (2^{(N-1)} - K)i/2$$

where K is as previously defined.

The currents I3, I4 are fed to the subtraction circuit 16 where each is summed with the current from the sample and hold stage 13 of the opposite type. Thus, the inverted current I4 from the DAC 15 is summed with the non-inverted current I2 from the amplifier 27. This has the effect of achieving subtraction. These currents are then fed into resistive loads 42 defined by a pair of resistors in series. An option is to feed the currents into the resistors via an impedance transformation stage such as a common-base amplifier. This has the effect of modifying the signals from current signals to voltage signals V1, V2 defined as:

$$V1 = R(I_T/2 - gm\ Vin/2 + 2^{(N-1)}\ i/2 + Ki/2)$$

$$V2 = R(I_T/2 + gm\ Vin/2 + 2^{(N-1)}\ i/2 - Ki/2)$$

The difference between these two voltages is given as:

$$V2 - V1 = R(gm\ Vin - Ki)$$

The two voltages are applied to a unity gain buffer 43 which generates complementary output signals which are fed to the flash converter 17 which is similar to the flash converter 14. Indeed, in certain cases, the two flash converters 14, 17 could be constituted by the same circuit with appropriate switching. Furthermore, the resistor chains of the flash converter 17 could themselves act as the load resistors instead of providing a separate set of load resistors 42.

The output from the flash converter 17 is fed to the ALU 16 where it is summed appropriately with the 7 bit output from the flash converter 14 to generate a final 12 bit output corresponding to Vin.

The ALU 18 performs the summation $$N_{output} = K1 + K2/G$$

where $K_1$ in the digital output of the first flash conversion and $K_2$ the output of the second.
G is as previously defined
$$K_2 = Vin_2/I_2\ R_2 = R_L(g_m\ Vin - K_1i)/I_2\ R_2$$

derived from a similar analysis to that of the first flash converter.

so N output =

$$K_1 + R_L g_m V_{in}/G\, I_2\, R_2 - K_1 R_L i/G I_2\, R_2 = \frac{g_m}{i} V_{in}$$

provided $\frac{R_L i}{G I_2 R_2} = 1$

This equality is achieved by scaling and matching resistors and current sources with the monolithic I.C.

It is necessary to ensure that the currents which are summed or subtracted are matched which leads to a consideration of the values of $g_m$, K, i, and R. Suitable values for these variables can be determined by analysing the circuit.

We claim:

1. An analogue to digital converter comprising a first analogue to digital conversion stage for performing a relatively coarse conversion on a sample of an analogue input signal; a sample and hold stage for holding the sample of the analogue signal fed to the first conversion stage while it is converted by the first conversion stage; a digital to analogue conversion stage to which the digital output from the first conversion stage is fed; difference means for generating an analogue difference signal representing the difference between the signal held by the sample and hold stage and the output from the digital to analogue conversion stage; a second analogue to digital conversion stage for generating a digital output corresponding to the difference signal; and combining means for combining the digital outputs of the first and second conversion stages to generate a digital output representing the sampled analogue input signal characterized in that the sample and hold stage and the first and second analogue to digital conversion stages each responds to a respective pair of differential input signals; in that each of the sample and hold and digital to analogue conversion stages generates output signals in the form of differential pairs of currents; and in that the difference means arithmetically combines appropriate pairs of the currents from the sample and hold and digital to analogue conversion stages to generate a differential current pair for input to the second analogue to digital conversion stage.

2. A converter according to claim 1, wherein the difference means arithmetically sums the current outputs of opposite type from the sample and hold and digital to analogue conversion stages.

3. A converter according to claim 1 or claim 2, wherein the output currents from the sample and hold stage are of the form $$I/2 \pm g_m V_{in}/2$$

where

I is the total current generated by the sample and hold circuit, $g_m$ is a scaling factor; and $V_{in}$ is the input analogue signal.

4. A converter according to claim 1, wherein the digital to analogue conversion stage has $2^N$ current sources, each generating a current having a magnitude of $i/2$, wherein N is the maximum number of bits in the output signal from the first analogue to digital conversion stage, and wherein the output currents from the digital to analogue conversion stage are of the form $$2(N-1) i/2 \pm K i/2$$

where

K is an integer dependent on the magnitude of the input analogue signal to the first analogue to digital conversion stage.

5. A converter according to claim 1, wherein the difference means comprises a pair of resistors connected in series, the resistor pair being connected in parallel with the second analogue to digital conversion stage, the current outputs of opposite type from the sample and hold and digital to analogue stages being combined at respective points connected in parallel with the resistor pair.

6. A converter according to claim 1, wherein each analogue to digital conversion stage includes a flash converter.

* * * * *